United States Patent
Matsumoto et al.

(10) Patent No.: US 6,720,241 B2
(45) Date of Patent: Apr. 13, 2004

(54) METHOD FOR MANUFACTURING SEMICONDUCTOR DEVICE

(75) Inventors: Michikazu Matsumoto, Uji (JP); Naohisa Sengoku, Takatsuki (JP); Ayumi Kobayashi, Kawasaki (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/172,750

(22) Filed: Jun. 17, 2002

(65) Prior Publication Data

US 2003/0022473 A1 Jan. 30, 2003

(30) Foreign Application Priority Data

Jun. 18, 2001 (JP) ........................................ 2001-183159

(51) Int. Cl.$^7$ ............................................. H01L 21/265
(52) U.S. Cl. ........................ 438/520; 438/522; 438/528
(58) Field of Search ................................. 438/658, 510, 438/520, 522, 528, 530, 532

(56) References Cited

U.S. PATENT DOCUMENTS 5,316,969 A * 5/1994 Ishida et al. ................. 438/510
5,956,603 A * 9/1999 Talwar et al. ............... 438/520

* cited by examiner

*Primary Examiner*—Caridad Everhart
(74) *Attorney, Agent, or Firm*—McDermott, Will & Emery

(57) ABSTRACT

In a method for manufacturing a semiconductor device, impurity ion is implanted into a semiconductor layer so as to form an ion implantation region in the semiconductor layer, and at least the ion implantation region is turned amorphous. Then, an insulating film is formed on the semiconductor layer at a temperature at which the ion implantation region is not crystallized, and then the semiconductor layer is annealed in a non-oxidizing atmosphere so as to activate the impurity ion implanted into the semiconductor layer.

23 Claims, 14 Drawing Sheets

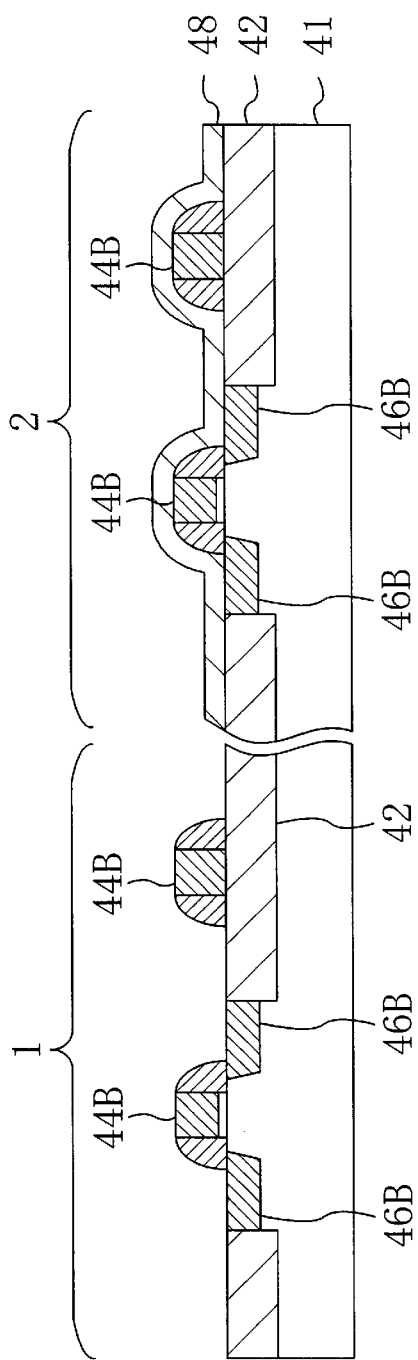
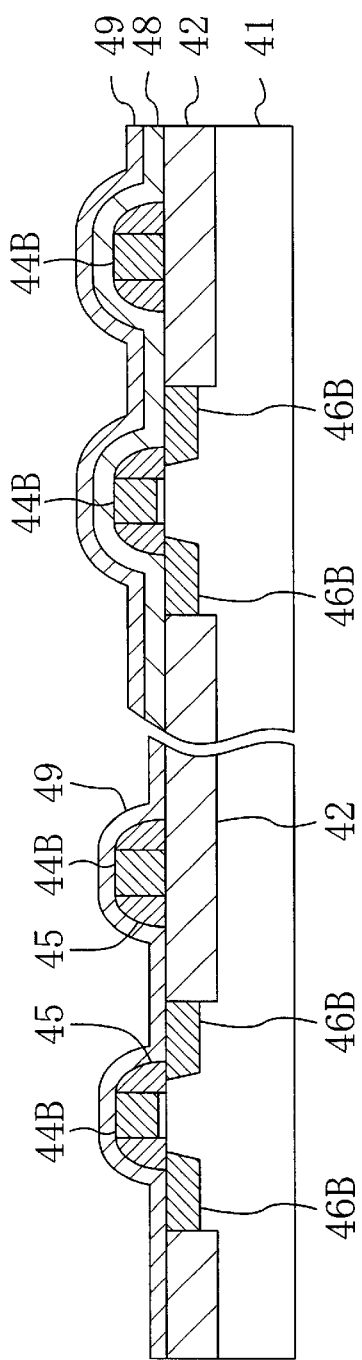
FIG. 11A
FIG. 11B

METHOD FOR MANUFACTURING SEMICONDUCTOR DEVICE

BACKGROUND OF THE INVENTION

The present invention relates to a method for manufacturing a semiconductor device, including a heat treatment method for activating impurity ion, which has been implanted into a semiconductor layer.

In recent years, there is an ever increasing demand for manufacturing processes for LSIs including MOS transistors in which the MOS transistors are miniaturized in order to further increase the speed and the degree of integration of LSIs.

In order to make advancements in the miniaturization of MOS transistors, it is necessary not only to reduce the gate length and the gate width of a transistor but also to reduce the height of the gate electrode and to realize shallower junctions by shallowing the junction plane of a source/drain diffusion layer.

Typically, a gate electrode of a MOS transistor is produced by forming a gate insulating film on a semiconductor substrate made of silicon, depositing a semiconductor layer made of polysilicon or amorphous silicon on the gate insulating film, and implanting impurity ion into the deposited semiconductor layer by an ion implantation method, so as to obtain an intended conductivity. Moreover, the source/drain diffusion layer is also formed by implanting impurity ion into the semiconductor substrate.

Herein, if the height of the gate electrode, i.e., the thickness of the deposited polysilicon film or amorphous silicon film, is reduced, it is necessary to also reduce the acceleration energy in the ion implantation when introducing an impurity. Similarly, it is necessary to reduce the acceleration energy in the ion implantation also for realizing a shallower junction of the source/drain diffusion layer.

On the other hand, in order to activate the impurity ion implanted into the semiconductor layer so as to provide a sufficient conductivity to the semiconductor layer despite the reduction in the acceleration energy, it is necessary to perform an annealing process for activating the impurity ion.

In the prior art, impurity ion is implanted into a semiconductor layer made of polycrystalline or amorphous silicon, and the implanted impurity ion is activated by performing an activation annealing process at a temperature of 700° C. or more with the semiconductor layer being exposed, or by performing an activation annealing process at a temperature of 700° C. or more after depositing a protection insulating film (cap layer) for an outward diffusion protection at a temperature of 700° C. or more on the semiconductor layer.

FIRST CONVENTIONAL EXAMPLE

A method for manufacturing a semiconductor device according to the first conventional example will now be described with reference to the drawings with respect to the activation annealing step for activating impurity ion, which has been implanted into a semiconductor layer.

FIG. 13(a) to FIG. 13(c) are cross-sectional views sequentially illustrating an impurity ion implantation step and an impurity ion activation annealing step according to the first conventional example.

First, as illustrated in FIG. 13(a), a semiconductor layer 102 made of amorphous silicon having a thickness of about 80 nm is deposited on an insulating film 101.

Then, as illustrated in FIG. 13(b), boron ($B^+$) ion, for example, is implanted under implantation conditions including an acceleration energy of about 3 keV and an implantation dose of about $5\times10^{15}$ $cm^{-2}$, thereby forming an ion implantation region 102a in an upper portion of the semiconductor layer 102.

Then, as illustrated in FIG. 13(c), the semiconductor layer 102, into which boron ion has been implanted, is subjected to an activation annealing process in a nitrogen atmosphere at a temperature of about 900° C. for about 30 minutes. Thus, the boron ion in the ion implantation region 102a is activated in the semiconductor layer 102, and diffuses through thermal diffusion to the vicinity of the interface with the insulating film 101.

By the activation annealing process, a portion of the implanted boron ion comes out of the semiconductor layer 102 through outward diffusion, and the semiconductor layer 102 is polycrystallized into a polysilicon layer 102B.

In order to reduce the outward diffusion, a nitrogen atmosphere containing oxygen ($O_2$) is used in some cases as the annealing atmosphere. However, even if oxygen is contained in the annealing atmosphere, the outward diffusion cannot be suppressed completely, and the thickness of the polysilicon layer 102B is reduced because a surface portion of the semiconductor layer 102 is oxidized at the same time.

SECOND CONVENTIONAL EXAMPLE

The second conventional example will now be described with reference to the drawings.

FIG. 14(a) to FIG. 14(d) are cross-sectional views sequentially illustrating a heat treatment process for activating impurity ion according to the second conventional example.

First, as illustrated in FIG. 14(a), a semiconductor layer 102 made of amorphous silicon having a thickness of about 80 nm is deposited on an insulating film 101.

Then, as illustrated in FIG. 14(b), boron ($B^+$) ion, for example, is implanted under implantation conditions including an acceleration energy of about 3 keV and an implantation dose of about $5\times10^{15}$ $cm^{-2}$, thereby forming an ion implantation region 102a in an upper portion of the semiconductor layer 102.

Then, as illustrated in FIG. 14(c), a silicon oxide ($SiO_2$) film 104 as a protection insulating film is deposited on the semiconductor layer 102 by using a CVD method. Since the deposition temperature of the silicon oxide film 104 is typically 600° C. or more, a surface oxide film 103 is formed in a surface portion of the semiconductor layer 102 while the outward diffusion of boron ion also occurs. Furthermore, the semiconductor layer 102 is polycrystallized into a polysilicon layer 102A.

Now, a silicon oxide film obtained by using a CVD method, which is typically used in a transistor formation process (front end process) for LSIs, will be described.

First, a TEOS film is a silicon oxide film whose reaction temperature is about 650° C. to 750° C. and which is obtained through thermal decomposition of tetraethylorthosilicate (TEOS: $Si(OC_2H_5)_4$). During the deposition, an oxygen gas is added to a TEOS gas.

Next, an HTO film is a silicon oxide film whose reaction temperature is about 700° C. to 900° C. and which is obtained through a thermal reaction of dinitrogen monoxide ($N_2O$) with monosilane ($SiH_4$) or dichlorosilane ($SiH_2Cl_2$).

Incidentally, the silicon oxide film 104 illustrated in FIG. 14(c) is an HTO film.

Then, as illustrated in FIG. 14(d), the semiconductor layer 102, into which boron ion has been implanted, is subjected to an activation annealing process in a nitrogen atmosphere at a temperature of about 900° C. for about 30 minutes. Thus, the boron ion is activated in the polysilicon layer 102A, and diffuses through thermal diffusion to the vicinity of the interface with the insulating film 101 to form a polysilicon layer 102B.

As described above, with the first conventional example, it is not possible to obtain a predetermined impurity profile due to the occurrence of outward diffusion. Moreover, when an oxygen gas is added to the nitrogen atmosphere in order to suppress the outward diffusion, the semiconductor layer 102 is oxidized, thereby failing to obtain an intended thickness.

Moreover, with the second conventional example, the outward diffusion occurs during the deposition of the silicon oxide film 104, and the semiconductor layer 102 is exposed to an oxygen-containing gas in an early stage of the deposition, whereby the surface thereof is oxidized to form the surface oxide film 103. This is because of the following reason. When the silicon oxide film 104 is deposited at a temperature of 500° C. or more, the semiconductor layer 102 is recrystallized (turned into polysilicon) to form the polysilicon layer 102A, and a large number of crystal grain boundaries occur in the polysilicon layer 102A, whereby the outward diffusion of impurity ion is likely to occur between these crystal grain boundaries.

Particularly, it is required to reduce the acceleration energy for the impurity implantation in order to reduce the height of the gate electrode and to shallow the source/drain diffusion layer so as to miniaturize MOS transistors. Therefore, the outward diffusion is more likely to occur, and the influence of the surface oxide film 103 on the operating characteristics of transistors is increased.

Moreover, in a case where a silicide film made of a high melting point metal such as tungsten silicide ($WSi_2$) or a high melting point metal film such as tungsten (W) is provided in a MOS transistor, the silicide layer or the high melting point metal layer is oxidized (abnormally oxidized) during the activation annealing process containing an oxygen gas and during the deposition of a TEOS film or an HTO film by using a CVD method.

SUMMARY OF THE INVENTION

The present invention has been made to solve the problems in the prior art, and has an object to make it possible to suppress the outward diffusion of an implanted impurity from a semiconductor layer and a surface oxidization of the semiconductor layer during the process of activating the impurity, which has been implanted into the semiconductor layer.

In order to achieve the object, the present invention provides a method for manufacturing a semiconductor device, in which an insulating film to be a cap layer is formed at a low temperature of about 500° C. or less on a semiconductor layer, into which impurity ion has been implanted, and an activation annealing process for activating the impurity ion is performed at a temperature of about 700° C. or more and in a non-oxidizing atmosphere.

Specifically, a first method for manufacturing a semiconductor device of the present invention includes: a first step of implanting impurity ion into a semiconductor layer so as to form an ion implantation region in the semiconductor layer, and turning at least the ion implantation region amorphous; a second step of forming an insulating film on the semiconductor layer at a temperature at which the ion implantation region is not crystallized; and a third step of, after the second step, annealing the semiconductor layer in a non-oxidizing atmosphere so as to activate the impurity ion implanted into the semiconductor layer.

According to the first method for manufacturing a semiconductor device, at least an ion implantation region in a semiconductor layer is turned amorphous, and an insulating film is formed on the semiconductor layer at a temperature at which the ion implantation region is not crystallized, whereby the outward diffusion can be suppressed by the insulating film covering the semiconductor layer. In addition, since the insulating film is deposited at a temperature at which the ion implantation region is not crystallized, it is possible to also prevent the formation of a surface oxide film on the semiconductor layer in an early stage of the deposition. Moreover, even in a case where a metal silicide film or a high melting point metal film is formed on the semiconductor layer, for example, the metal silicide film or the high melting point metal film is not abnormally oxidized during the formation of the insulating film.

In the first method for manufacturing a semiconductor device, it is preferred that the semiconductor layer is deposited in an amorphous state in the first step, after which the impurity ion is implanted. This corresponds to, for example, a case where a semiconductor layer is formed in an amorphous state as a gate electrode forming layer. When an insulating film is formed on an amorphous semiconductor layer at a temperature of about 500° C. or less, the semiconductor layer is not recrystallized, whereby it is possible to prevent the outward diffusion occurring due to crystal grain boundaries.

Moreover, in the first method for manufacturing a semiconductor device, it is preferred that the semiconductor layer is deposited in a polycrystalline state in the first step, after which the impurity ion is implanted into the deposited semiconductor layer, thereby turning the ion implantation region amorphous. This corresponds to, for example, a case where a semiconductor layer is formed as an impurity diffusion layer such as a source/drain. Even in a case where the semiconductor layer is a single crystal layer, an ion implantation region of the semiconductor layer is turned amorphous if it is implanted at a relatively high dose. Therefore, an insulating film is formed on the ion implantation region, which has been turned amorphous, in the semiconductor layer at a temperature at which the ion implantation region is not crystallized, whereby the ion implantation region is not recrystallized, and thus it is possible to prevent the outward diffusion occurring due to crystal grain boundaries.

A second method for manufacturing a semiconductor device of the present invention includes: a first step of forming a gate insulating film on a semiconductor substrate; a second step of forming a semiconductor layer made of amorphous silicon or polycrystalline silicon on the gate insulating film; a third step of implanting impurity ion into a gate electrode forming region of the semiconductor layer so as to form an ion implantation region in the gate electrode forming region; a fourth step of, after the third step, forming an insulating film on the semiconductor layer at a temperature at which the ion implantation region is not crystallized; a fifth step of, after the fourth step, annealing the semiconductor layer in a non-oxidizing atmosphere so as to activate the impurity ion; and a sixth step of, after the fifth step, patterning the gate electrode forming region of the semiconductor layer so as to form a gate electrode from the semiconductor layer.

The second method for manufacturing a semiconductor device is a method for forming a gate electrode in a MIS transistor, in which an ion implantation region, into which impurity ion is implanted, is formed in a gate electrode forming region of a semiconductor layer made of amorphous silicon or polycrystalline silicon, after which an insulating film is formed on the ion-implanted semiconductor layer at a temperature at which the ion implantation region is not crystallized, and then the semiconductor layer is annealed in a non-oxidizing atmosphere. Therefore, as in the first method for manufacturing a semiconductor device of the present invention, it is possible to suppress the outward diffusion of impurity ion from the semiconductor layer and the formation of a surface oxide film on the semiconductor layer.

In the first or second method for manufacturing a semiconductor device, it is preferred that: the temperature at which the semiconductor layer is not crystallized is a temperature of 500° C. or less; and a temperature of the annealing is 700° C. or more.

A third method for manufacturing a semiconductor device of the present invention includes: a first step of sequentially forming a gate insulating film and a gate electrode on a semiconductor substrate made of silicon; a second step of implanting impurity ion onto the semiconductor substrate using the gate electrode as a mask so as to form an amorphous ion implantation region in the semiconductor substrate; a third step of forming an insulating film across an entire upper surface of the semiconductor substrate including the gate electrode at a temperature at which the ion implantation region is not crystallized; and a fourth step of, after the third step, annealing the semiconductor substrate in a non-oxidizing atmosphere so as to activate the impurity ion, thereby forming an impurity diffusion layer in a region of the semiconductor substrate beside the gate electrode.

The third method for manufacturing a semiconductor device is a method for forming an impurity diffusion layer in a MIS transistor, in which impurity ion is implanted onto a semiconductor substrate using a gate electrode as a mask so as to form an ion implantation region in the semiconductor substrate, after which an insulating film is formed across the entire upper surface of the ion-implanted semiconductor substrate including the gate electrode at a temperature at which the ion implantation region is not crystallized, and then the semiconductor substrate is annealed in a non-oxidizing atmosphere. Therefore, as in the first method for manufacturing a semiconductor device of the present invention, it is possible to suppress the outward diffusion of impurity ion from the impurity diffusion layer and the formation of a surface oxide film on the impurity diffusion layer. Moreover, in a case where the gate electrode is made of polysilicon into which impurity ion is implanted, it is possible to also suppress the outward diffusion of impurity ion from the gate electrode and the surface oxidization of the gate electrode.

It is preferred that the third method for manufacturing a semiconductor device further includes, after the fourth step, a fifth step of anisotropically etching the insulating film so as to form a side wall, which is made of the insulating film, on a side surface of the gate electrode.

In this way, the side wall of the gate electrode can be formed from the insulating film for preventing outward diffusion during the activation annealing process, whereby it is possible to simplify the manufacturing process. In addition, when impurity ion is implanted again using the formed side wall and the gate electrode as a mask, the initial impurity diffusion layer can made to function as an LDD diffusion layer, an extension diffusion layer or a pocket diffusion layer.

In this case, it is preferred that method for manufacturing a third semiconductor device further includes, after the fifth step: a sixth step of depositing a metal film across an entire upper surface of the semiconductor substrate including the gate electrode; and a seventh step of subjecting the deposited metal film to a heat treatment so as to form a metal silicide film along an interface between the metal film and the gate electrode and an interface between the metal film and the impurity diffusion layer.

In this way, an upper portion of the gate electrode or the impurity diffusion layer is silicified, whereby it is possible to reduce the resistance of the gate electrode or the contact resistance of the impurity diffusion layer.

In this case, it is preferred that the metal silicide film is made of tungsten silicide, molybdenum silicide, titanium silicide, cobalt silicide or nickel silicide.

In the third method for manufacturing a semiconductor device, it is preferred that the first step includes a step of forming a metal film or a metal silicide film on the gate electrode.

In this way, the gate electrode is in a polymetal electrode structure having a metal film in an upper portion thereof or a polycide electrode structure having a metal silicide film in an upper portion thereof. In addition, since the insulating film is formed at a temperature of about 500° C. or less, the metal film or the metal silicide film is not substantially oxidized.

In this case, it is preferred that: the metal film is made of tungsten; and the metal silicide film is made of tungsten silicide, molybdenum silicide, titanium silicide, cobalt silicide or nickel silicide.

A fourth method for manufacturing a semiconductor device of the present invention includes: a first step of sequentially forming a gate insulating film and a gate electrode containing silicon on a semiconductor substrate made of silicon and having a first region and a second region; a second step of implanting impurity ion onto the semiconductor substrate using the gate electrode as a mask so as to form an ion implantation region in the semiconductor substrate and turning the ion implantation region amorphous; a third step of forming an insulating film across an entire upper surface of the semiconductor substrate including the gate electrode at a temperature at which the ion implantation region is not crystallized; a fourth step of, after the third step, annealing the semiconductor substrate in a non-oxidizing atmosphere so as to activate the impurity ion, thereby forming an impurity diffusion layer in a region of the semiconductor substrate beside the gate electrode; a fifth step of, after the fourth step, removing a portion of the insulating film that is included in the first region and that is above the gate electrode or the impurity diffusion layer; and a sixth step of, after the fifth step, depositing a metal film across an entire upper surface in the first region and the second region and subjecting the deposited metal film to a heat treatment so as to form a metal silicide film along an interface between the metal film and the gate electrode and an interface between the metal film and the impurity diffusion layer in the first region.

According to the fourth method for manufacturing a semiconductor device, an insulating film is formed on a semiconductor substrate, into which impurity ion has been implanted to form an ion implantation region, at a temperature at which the ion implantation region is not crystallized in the third step, and annealing is performed in a non-oxidizing atmosphere so as to activate the impurity ion in the semiconductor substrate in the fourth step. In this way, effects as those of the first method for manufacturing a semiconductor device of the present invention can be obtained. In addition, a portion of the insulating film that is included in the first region and that is above the gate electrode or the impurity diffusion layer is removed in the fifth step, thereby leaving the insulating film included in the second region. Therefore, when preventing the silicification of the gate electrode and the impurity diffusion layer in the second region, it is no longer necessary to separately form a mask film for preventing silicification, whereby it is possible to simplify the manufacturing process.

In the third or fourth method for manufacturing a semiconductor device, it is preferred that: the temperature at which the semiconductor substrate is not crystallized is a temperature of 500° C. or less; and a temperature of the annealing is 700° C. or more.

In the first to fourth methods for manufacturing a semiconductor device, it is preferred that the insulating film is a silicon oxide film obtained by reacting tetraethylorthosilicate (TEOS) and ozone with each other. In this way, it is possible to reliably form an insulating film made of silicon oxide at a reaction temperature of about 500° C. or less.

In the first to fourth methods for manufacturing a semiconductor device, it is preferred that: the annealing is performed by a rapid thermal annealing (RTA) method or a furnace annealing (FA) method; and the non-oxidizing atmosphere is made of nitrogen or argon.

BRIEF DESCRIPTION OF THE DRAWINGS

FIG. 11(a) and FIG. 11(b) are cross-sectional views sequentially illustrating a silicification step in a method for manufacturing a semiconductor device according to a variation of the fourth embodiment of the present invention.

DETAILED DESCRIPTION OF THE INVENTION

First Embodiment

The first embodiment of the present invention will now be described with reference to the drawings.

The first embodiment focuses on the process of activating impurity ion, which has been implanted into a semiconductor layer.

FIG. 1(a) to FIG. 1(d) are cross-sectional views sequentially illustrating an impurity ion implantation step and an impurity ion activation annealing step in a method for manufacturing a semiconductor device according to the first embodiment of the present invention.

Figure 1A:
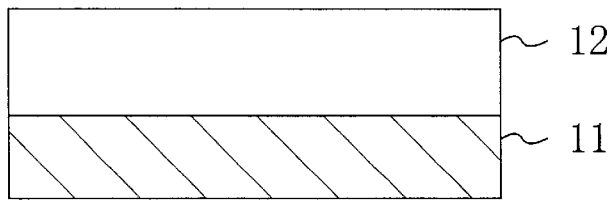
FIG. 1(a) to FIG. 1(d) are cross-sectional views sequentially illustrating an impurity ion implantation step and an impurity ion activation annealing step in a method for manufacturing a semiconductor device according to the first embodiment of the present invention.

First, as illustrated in FIG. 1(a), a semiconductor layer 12 made of amorphous silicon having a thickness of about 80 nm, for example, is deposited by a CVD method on an insulating film 11 made of silicon oxide, silicon nitride, or the like, which has been formed on a substrate (not shown).

Figure 1B:
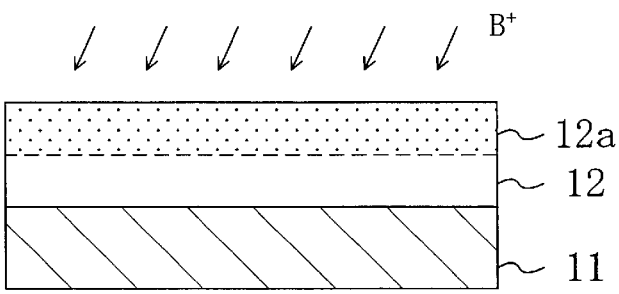

Then, as illustrated in FIG. 1(b), boron ($B^+$) ion, for example, is implanted under implantation conditions including an acceleration energy of about 3 keV and an implantation dose of about $5 \times 10^{15}$ $cm^{-2}$, thereby forming an ion implantation region 12a in an upper portion of the semiconductor layer 12.

Figure 1C:
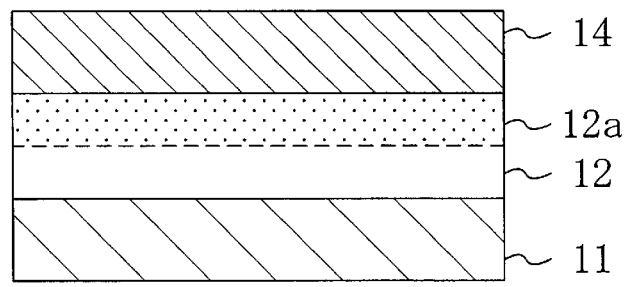

Then, as illustrated in FIG. 1(c), an NSG (non-doped silicate glass) film 14 for preventing outward diffusion, which is made of silicon oxide, is deposited on the semiconductor layer 12 by using a CVD method with the heater temperature being set to 400° C. (the actual substrate temperature being 370° C). Note that an NSG film as used herein refers to silicon oxide ($SiO_2$) that does not contain boron (B), phosphorus (P), or the like, and that is produced by reacting tetraethylorthosilicate (TEOS: Si(OC$_2$H$_5$)$_4$) and ozone (O$_3$) with each other at a pressure of about 2.7×10$^4$ Pa (=about 200 Torr).

Thus, according to the first embodiment, ozone is used as an oxidizing gas for TEOS, whereby it is possible to form a silicon oxide film at a low temperature of 400° C. or less. As a result, boron ion, which has been implanted into the ion implantation region 12a illustrated in FIG. 1(c), is not activated. In addition, since the NSG film 14 is deposited at a low temperature of 400° C. or less, the semiconductor layer 12 is not turned into polysilicon but remains amorphous. Therefore, even in an early stage of the deposition of the NSG film 14, the outward diffusion of implanted ion does not occur, and the surface of the semiconductor layer 12 is not substantially oxidized.

Furthermore, the NSG film 14, which is deposited by using ozone and TEOS, has a good coverage, and there is little damage to the semiconductor layer 12 during the deposition.

Note that the NSG film 14 can be deposited desirably if the heater temperature is set to 500° C. or less.

Figure 1D:
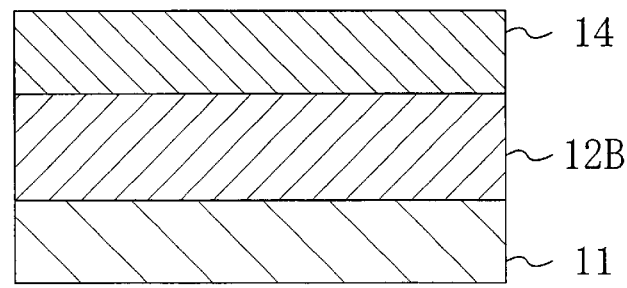
Figure 2A:
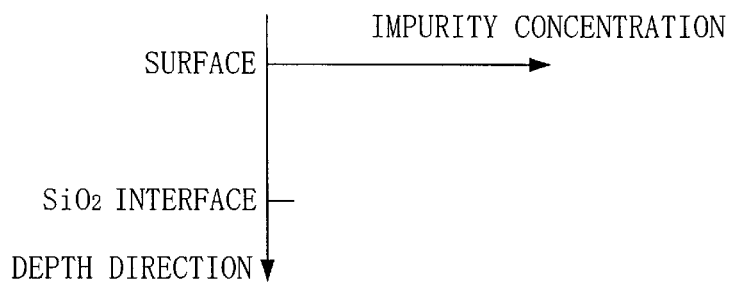
FIG. 2(a) to FIG. 2(d) are graphs corresponding respectively to FIG. 1(a) to FIG. 1(d), each showing a concentration distribution of boron ion implanted into a semiconductor layer in the method for manufacturing a semiconductor device according to the first embodiment of the present invention.
Figure 2B:
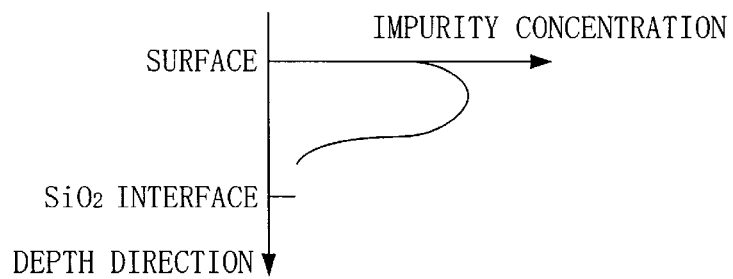
Figure 2C:
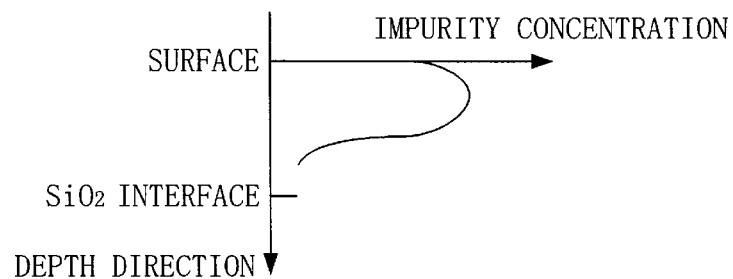
Figure 2D:
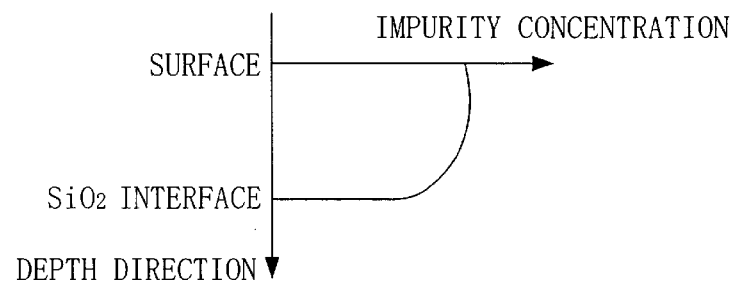

Then, as illustrated in FIG. 1(d), the semiconductor layer 12, into which boron ion has been implanted, is subjected to an activation annealing process by using a furnace annealing (FA) method in a nitrogen atmosphere at a temperature of about 900° C. for about 30 minutes. Thus, the boron ion in the ion implantation region 12a is activated, and diffuses through thermal diffusion to the vicinity of the interface with the insulating film 11, while the amorphous semiconductor layer 12 is recrystallized to form a polysilicon layer 12B.

At this time, the boron ion in the ion implantation region 12a diffuses into the NSG film 14 but does not diffuse to the outside (no outward diffusion). Moreover, since the NSG film 14 is deposited on the surface of the semiconductor layer 12, a surface oxide film is not formed on the semiconductor layer 12 even if the activation annealing process is performed, whereby the thickness of the polysilicon layer 12B is not reduced.

FIG. 2(a) to FIG. 2(d), corresponding respectively to FIG. 1(a) to FIG. 1(d), each show a concentration distribution of boron ion implanted into the semiconductor layer 12 according to the first embodiment. From the impurity concentration before the deposition of the NSG film 14, shown in FIG. 2(b), and that after the deposition of the NSG film 14, shown in FIG. 2(c), it can be seen that substantially no outward diffusion of boron ion is caused by the deposition of the NSG film 14. Thus, in the activation annealing process shown in FIG. 2(d), the implanted boron ion is activated more efficiently than in the first conventional example and the second conventional example.

Figure 3:
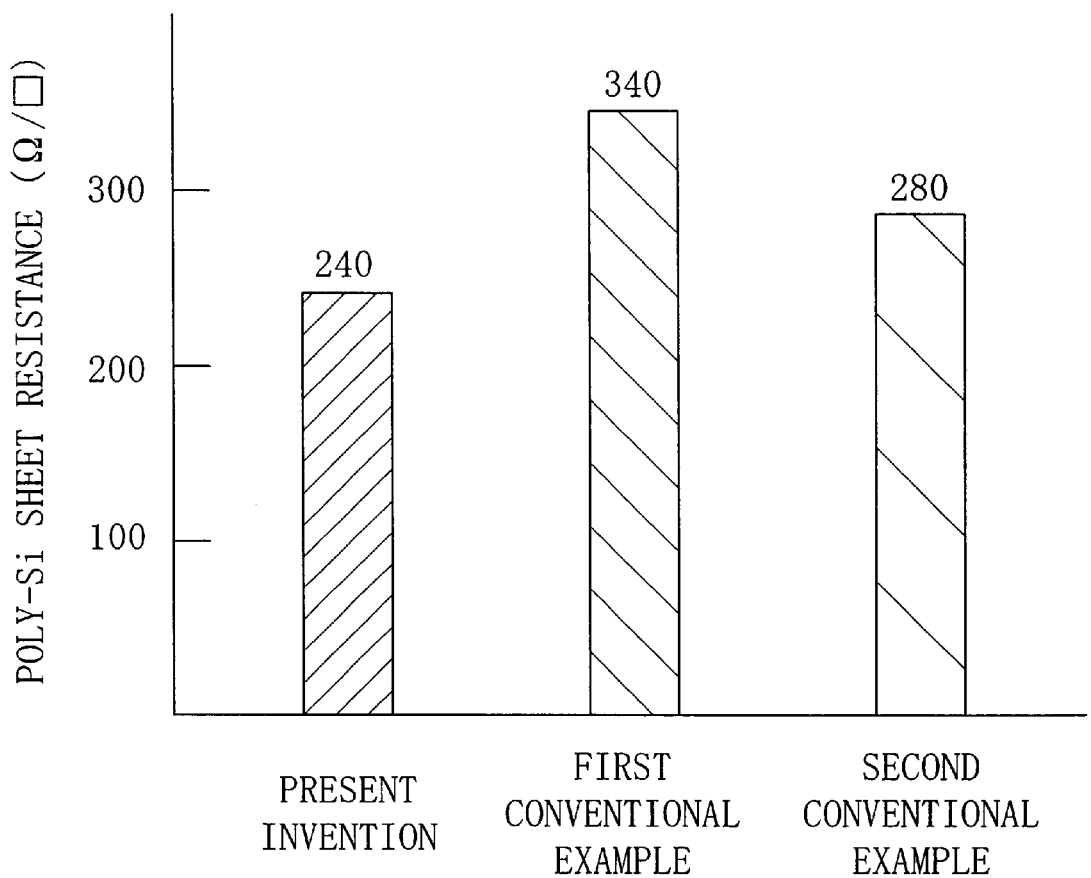
FIG. 3 is a graph showing an evaluation of an impurity ion activation process of the method for manufacturing a semiconductor device according to the first embodiment of the present invention, in terms of a measured sheet resistance value of a polysilicon film after the activation process, in comparison with the conventional examples.

FIG. 3 is the result of evaluation of the effect of an impurity ion activation process according to the first embodiment of the present invention, showing the result of measurement of a sheet resistance value of a polysilicon film after the activation process. For the purpose of comparison, the sheet resistance of each of the polysilicon film of the first conventional example and the polysilicon film of the second conventional example is also shown.

As illustrated in FIG. 3, the sheet resistance value of the polysilicon film according to the first embodiment is 240 Ω/□, which is considerably lower than the sheet resistance value of 340 Ω/□ of the first conventional example, and is also lower than the sheet resistance value of 280 Ω/□ of the second conventional example.

It is believed that in the first conventional example, since the activation annealing process is performed with the surface of the semiconductor layer 102 being exposed, a significant outward diffusion of boron ion occurs, thereby substantially reducing the amount of boron in the polysilicon layer 102B and increasing the sheet resistance.

Moreover, it is believed that in the second conventional example, the sheet resistance value increases since the outward diffusion of boron ion occurs in an early stage of the deposition of the silicon oxide (HTO) film 104 and the surface oxide film 103 is formed on the surface of the semiconductor layer 102.

Note that while boron, which is a group III element, is used as impurity ion in the first embodiment, the impurity ion is not limited to boron ion or to a group III element.

Moreover, while amorphous silicon is used for the semiconductor layer 12 in the first embodiment, polycrystalline silicon (polysilicon) may be used alternatively. In such a case, the effect of the present invention can be obtained more reliably if at least the ion implantation region of the polycrystalline silicon is turned amorphous by the impurity ion implantation.

For example, the dose at which the ion implantation region is turned amorphous is 3×10$^{15}$ cm$^{-2}$ or more for boron (B$^+$) ion, which is a p-type impurity, 1×10$^{15}$ cm$^{-2}$ or more for arsenic (As$^+$) ion, which is an n-type impurity, and 3×10$^{15}$ cm$^{-2}$ or more for phosphorus (P$^+$) ion.

Second Embodiment

The second embodiment of the present invention will now be described with reference to the drawings.

FIG. 4(a) to FIG. 4(d) and FIG. 5(a) to FIG. 5(c) are cross-sectional views sequentially illustrating a step of forming a gate electrode of a P-channel MOS transistor in a method for manufacturing a semiconductor device according to the second embodiment of the present invention.

Figure 4A:
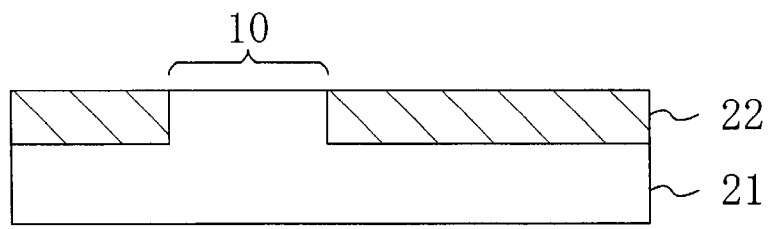
FIG. 4(a) to FIG. 4(d) are cross-sectional views sequentially illustrating a step of forming a gate electrode of a MOS transistor in a method for manufacturing a semiconductor device according to the second embodiment of the present invention.

First, as illustrated in FIG. 4(a), a shallow trench isolation (STI) region 22 for device isolation is selectively formed in an upper portion of a semiconductor substrate 21 made of silicon.

Figure 4B:
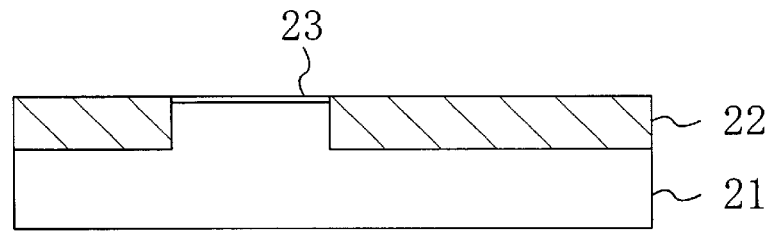

Then, as illustrated in FIG. 4(b), a gate insulating film 23 made of an oxynitride film having a thickness of about 2.8 nm is formed in a transistor forming region 10 on the upper surface of the semiconductor substrate 21 by subjecting the semiconductor substrate 21 to a heat treatment.

Figure 4C:
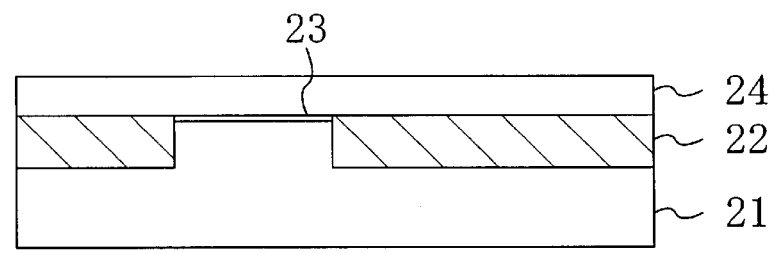

Then, as illustrated in FIG. 4(c), a gate electrode forming layer 24 made of amorphous silicon having a thickness of about 80 nm is deposited across the entire upper surface of the semiconductor substrate 21 by using a CVD method.

Figure 4D:
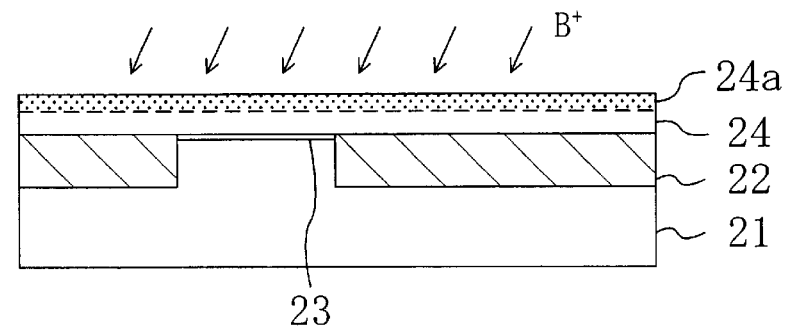

Then, as illustrated in FIG. 4(d), boron (B$^+$) ion is implanted into the gate electrode forming layer 24 under implantation conditions including an acceleration energy of about 3 keV and an implantation dose of about 5×10$^{15}$ cm$^{-2}$, thereby forming an ion implantation region 24a, into which boron ion has been implanted, in an upper portion of the gate electrode forming layer 24.

Figure 5A:
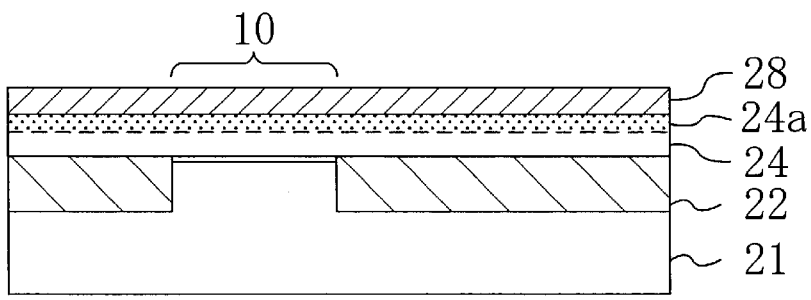
FIG. 5(a) to FIG. 5(c) are cross-sectional views sequentially illustrating a step of forming a gate electrode of a MOS transistor in the method for manufacturing a semiconductor device according to the second embodiment of the present invention.

Then, as illustrated in FIG. 5(a), an NSG film 28, which is an insulating film for preventing outward diffusion having a thickness of about 50 nm, is deposited on the gate electrode forming layer 24 by a CVD method in which ozone is used as an oxidizing gas for TEOS with a reaction pressure of about 2.7×10$^4$ Pa and a reaction temperature of 500° C. or less. In this process, the thickness of the NSG film 28 may be any thickness as long as it is possible to prevent the outward diffusion of the implanted impurity ion, and may be set to be 10 nm to 100 nm, for example.

Figure 5B:
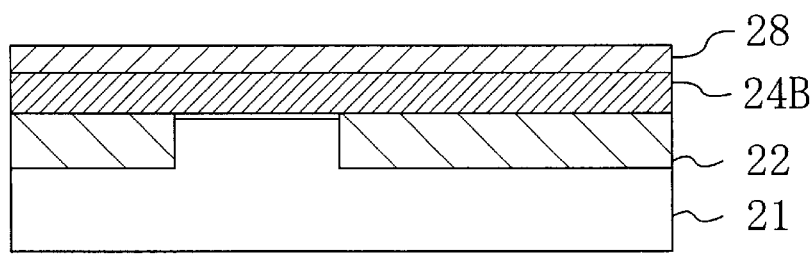

Then, as illustrated in FIG. 5(b), the gate electrode forming layer 24, into which boron ion has been implanted, is subjected to an activation annealing process in a nitrogen atmosphere at a temperature of about 750° C. for about 30 minutes. In this process, the annealing temperature is set to be about 750° C. because a heat treatment at a high temperature is performed in the source/drain formation step after the gate electrode formation. Thus, the boron ion in the ion implantation region 24a is activated, and diffuses through thermal diffusion to the vicinity of the interface with the gate insulating film 23 or the STI region 22. In this process, the amorphous gate electrode forming layer 24 is turned into a recrystallized gate electrode forming layer 24B having a P-type conductivity.

Figure 5C:
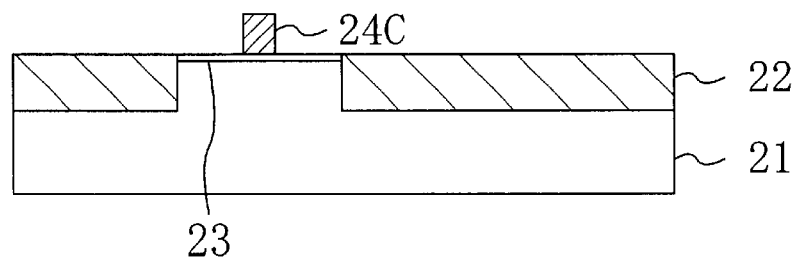

Then, as illustrated in FIG. 5(c), after the NSG film 28 is removed, the gate electrode forming layer 24B is selectively etched by using a mask pattern (not shown) obtained by a photolithography method, thereby forming a gate electrode 24C, which is made of the gate electrode forming layer 24B, in the transistor forming region 10 of the semiconductor substrate 21. In this process, an etching gas containing chlorine ($Cl_2$) or hydrogen bromide (HBr) is used for the etching of the gate electrode forming layer 24B, which is made of polysilicon.

Note that while the NSG film 28 on the gate electrode 24C is removed in FIG. 5(c), the NSG film 28 may be left unremoved. In this process, an etching gas containing, as its main component, fluorocarbon ($CF_4$, etc.) is used for the etching of the NSG film 28, which is made of silicon oxide.

As described above, according to the second embodiment, impurity ion is implanted into the gate electrode forming layer 24, which is made of amorphous silicon, and then an NSG film for preventing the outward diffusion is deposited at a relatively low temperature of about 500° C. or less, whereby it is possible to prevent the outward diffusion of boron ion in an early stage of the deposition. In addition, the surface of the gate electrode forming layer 24 is not oxidized, whereby it is possible to prevent the thickness of the gate electrode forming layer 24B from being reduced.

While a method for forming a gate electrode of a P-channel transistor section has been described in the second embodiment, an N-channel transistor section is also formed in a normal semiconductor device. Arsenic (As), phosphorus (P), or the like, which is a group V element, is used as impurity ion for a gate electrode forming layer of the N-channel transistor section.

In a case where the surface oxide film 103 is formed on the surface of the polysilicon layer 102A, as in the conventional examples, the thickness of the surface oxide film formed in the P-channel transistor section and the thickness of the surface oxide film formed in the N-channel transistor section are different from each other, whereby the thickness of the polysilicon layer, into which impurity ion has been diffused, in the P-channel transistor section is different from that in the N-channel transistor section, thus resulting in inconsistent characteristics between the transistors.

On the other hand, in the second embodiment, the surface oxide film is not formed on the surface of the gate electrode forming layer 24, whereby the thickness of the gate electrode forming layer in the P-channel transistor section is substantially the same as that in the N-channel transistor section.

Thus, according to the second embodiment, it is possible to prevent, in the gate electrode formation step, the outward diffusion of the implanted impurity ion and the surface oxidization of the gate electrode forming layer, whereby it is possible to efficiently activate the impurity ion, and thus to obtain a MOS transistor having intended operating characteristics.

Note that while amorphous silicon is used for the gate electrode forming layer 24, polycrystalline silicon (polysilicon) may be used alternatively. In a case where polycrystalline silicon is used for the gate electrode forming layer 24, the ion implantation region 24a is turned amorphous by the impurity ion implantation.

Variation of Second Embodiment

A variation of the second embodiment of the present invention will now be described with reference to the drawings.

Figure 6:
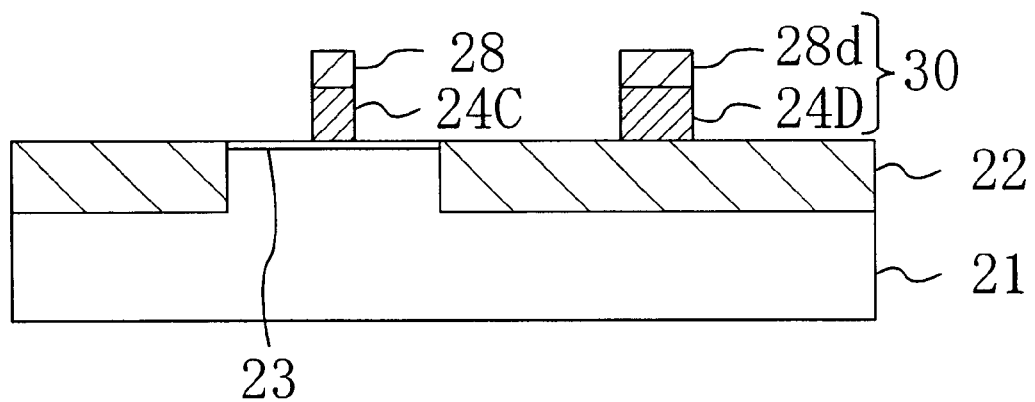
FIG. 6 is a cross-sectional view illustrating a gate electrode formation step and a resistor element formation step in a method for manufacturing a semiconductor device according to a variation of the second embodiment of the present invention.

FIG. 6 is a cross-sectional view illustrating a manufacturing step of forming a gate electrode and a resistor element in the same step and from the same member in a method for manufacturing a semiconductor device according to the variation of the second embodiment.

FIG. 6 is characterized in that a resistor element 30 is formed by patterning on the STI region 22, for example, simultaneously with the patterning of the gate electrode 24C using a photolithography method and an etching method, after the step of FIG. 5(b) illustrated in the second embodiment. Therefor, the NSG film 28 is left unremoved on the gate electrode 24C in the present variation.

The resistor element 30 includes a resistor body 24D made of the gate electrode forming layer 24B having a P-type conductivity and a protection insulating film 28d formed thereon and made of the NSG film 28.

When the resistor element 30 is formed in the same step as the gate electrode 24C, as described above, it is possible to prevent the outward diffusion of the implanted impurity ion and the surface oxidization in the resistor body 24D of the resistor element, whereby it is possible to obtain the resistor element 30 having intended characteristics.

Third Embodiment

The third embodiment of the present invention will now be described with reference to the drawings.

FIG. 7(a) to FIG. 7(d) and FIG. 8(a) to FIG. 8(c) are cross-sectional views sequentially illustrating a step of forming a gate electrode having a polymetal electrode structure of a P-channel MOS transistor and a step of forming a side wall of the gate electrode in a method for manufacturing a semiconductor device according to the third embodiment of the present invention.

Figure 7A:
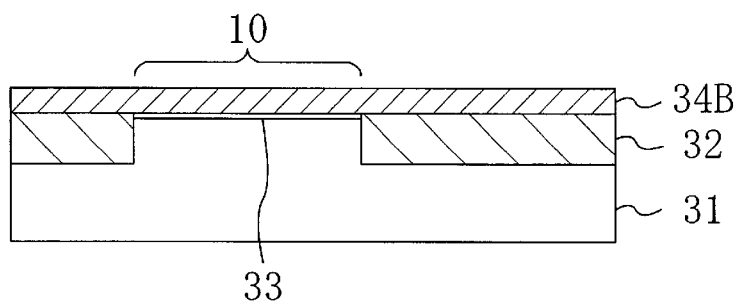
FIG. 7(a) to FIG. 7(d) are cross-sectional views sequentially illustrating a step of forming a gate electrode of a MOS transistor and a step of forming a side wall thereof in a method for manufacturing a semiconductor device according to the third embodiment of the present invention.

First, as illustrated in FIG. 7(a), an STI region 32 for device isolation is selectively formed in an upper portion of a semiconductor substrate 31 made of silicon. Then, a gate insulating film 33 made of an oxynitride film having a thickness of about 2.8 nm is formed in the transistor forming region 10 on the upper surface of the semiconductor substrate 31. Then, a lower gate electrode forming layer made of amorphous silicon having a thickness of about 80 nm is deposited, and boron ion is implanted, after which an activation annealing process for activating the boron ion is performed, thereby forming a lower gate electrode forming layer 34B made of polysilicon of a P-type conductivity.

Note that the activation annealing process for the lower gate electrode forming layer 34B may be performed by a known method such as the method of the first conventional example in which an insulating film for preventing outward diffusion is not provided on the lower gate electrode layer 34B or the method of the second conventional example in which an HTO film is used as insulating film for preventing outward diffusion, but it is preferably performed by using the activation annealing method of the present invention in which an NSG film is used as the insulating film for preventing outward diffusion.

Figure 7B:
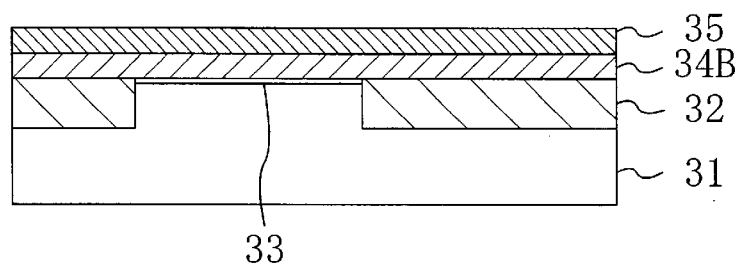

Then, as illustrated in FIG. 7(b), an upper gate electrode forming layer 35 made of tungsten (W) and having a thickness of about 60 nm is deposited across the entire upper surface of the lower gate electrode forming layer 34B by using a sputtering method or a CVD method.

Figure 7C:
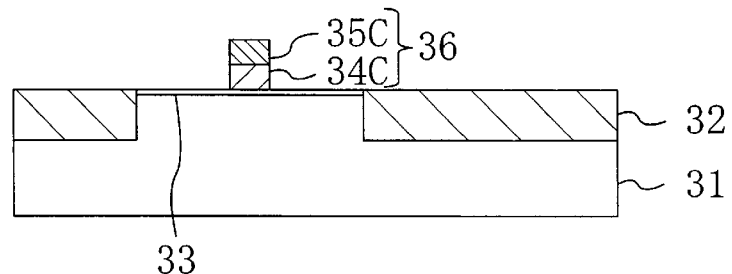

Then, the upper gate electrode forming layer 35 and the lower gate electrode forming layer 34B are selectively etched so as to form an upper gate electrode 35C from the upper gate electrode forming layer 35 and form a lower gate electrode 34C from the lower gate electrode forming layer 34B. Thus, a gate electrode 36 having a polymetal electrode structure including the lower gate electrode 34C and the upper gate electrode 35C thereon, thereby obtaining a structure as illustrated in FIG. 7(c).

Note that if tungsten silicide ($WSi_2$), molybdenum silicide ($MoSi_2$), titanium silicide ($TiSi_2$), cobalt silicide ($CoSi_2$) or nickel silicide ($NiSi_2$) is used for the upper gate electrode forming layer 35, it is possible to make the gate electrode 36 in a polycide electrode structure.

Herein, for the etching of the upper gate electrode forming layer 35, it is preferred to use an etching gas containing, as its main component, fluorocarbon ($CF_4$) and hydrogen bromide (HBr) in a case where tungsten is used, and it is preferred to use a similar etching gas also in a case where a metal silicide is used.

Figure 7D:
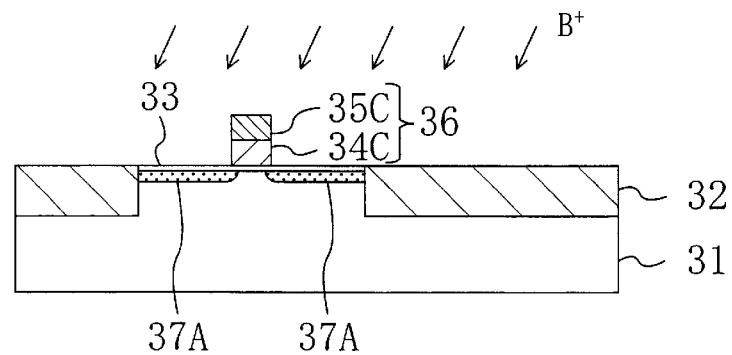

Then, as illustrated in FIG. 7(d), boron ($B^+$) ion, for example, is implanted into the semiconductor substrate 31 using the gate electrode 36 as a mask, thereby forming a shallow ion implantation region 37A whose junction depth is about 30 nm in an upper portion of the transistor forming region 10. In this process, the ion implantation region 37A is turned amorphous. Moreover, when the impurity concentration of the ion implantation region 37A is set to be substantially equal to that of the source/drain diffusion layer to be formed in a subsequent step, the ion implantation region 37A becomes an extension diffusion layer, which is effective in increasing the operating speed and suppressing a punch-through. Moreover, when the impurity concentration is lower than the impurity concentration of the source/drain diffusion layer, it becomes an LDD diffusion layer, which is effective in obtaining a resistance against hot carriers and suppressing the short channel effect. Moreover, when the ion implantation region 37A is formed by using, for example, phosphorus ion, which is an N-type impurity, an opposite conductivity type to that of the source/drain diffusion layer, and by implanting the ion so that the junction position is deeper than the LDD diffusion layer or the extension diffusion layer, the ion implantation region 37A becomes a pocket diffusion layer.

Figure 8A:
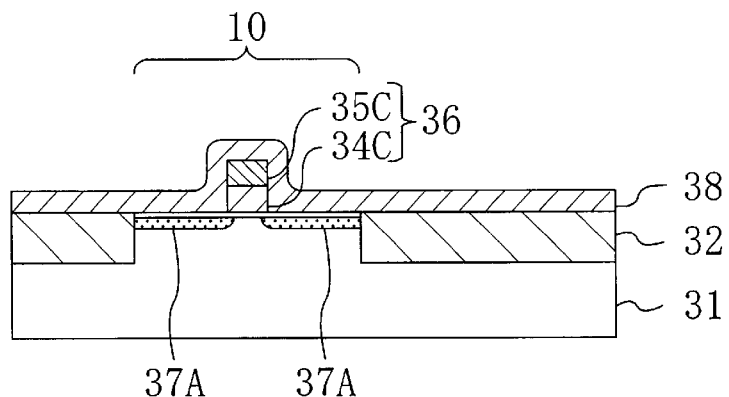
FIG. 8(a) to FIG. 8(c) are cross-sectional views sequentially illustrating a step of forming a gate electrode of a MOS transistor and a step of forming a side wall thereof in the method for manufacturing a semiconductor device according to the third embodiment of the present invention.

Then, as illustrated in FIG. 8(a), an NSG film 38, which is an insulating film for preventing outward diffusion having a thickness of about 80 nm, is deposited across the entire upper surface of the semiconductor substrate 31 including the gate electrode 36, by using a CVD method in which ozone is used as an oxidizing gas with a reaction pressure of about $2.7 \times 10^4$ Pa and a reaction temperature of 500° C. or less.

Figure 8B:
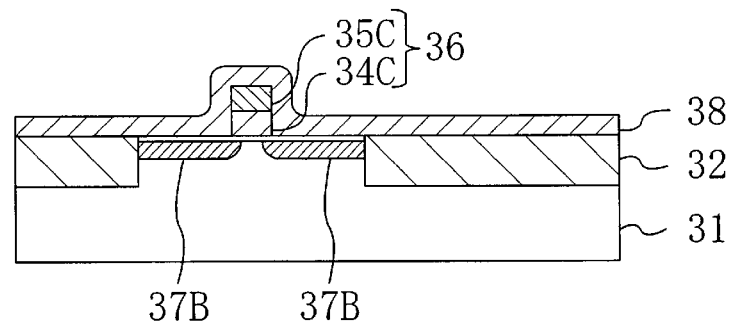

Then, as illustrated in FIG. 8(b), the ion implantation region 37A is subjected to an activation annealing process by a rapid thermal annealing (RTA) method in a nitrogen atmosphere at a temperature of about 850° C. for about 10 seconds. Thus, an impurity diffusion layer 37B is obtained by activating the boron ion, which has been implanted into the ion implantation region 37A.

Figure 8C:
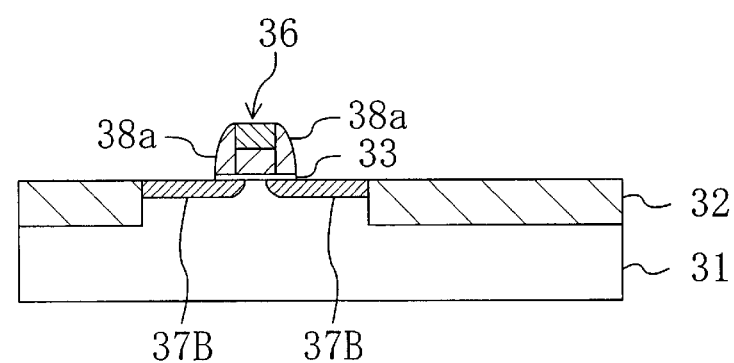

Then, as illustrated in FIG. 8(c), the NSG film 38 is subjected to an anisotropic dry etching process by using an etching gas containing fluorocarbon as its main component, thereby forming a side wall film 38a made of the NSG film 38 on both sides of the gate electrode 36.

As described above, according to the third embodiment, impurity ion is implanted into the transistor forming region 10 of the semiconductor substrate 31, and then the NSG film 38 for preventing outward diffusion is deposited at a relatively low temperature of about 500° C. or less, whereby it is possible to prevent the outward diffusion of boron ion from the transistor forming region 10 of the semiconductor substrate 31 and the lower gate electrode 34C in an early stage of the deposition. In addition, the surface of the transistor forming region 10 of the semiconductor substrate 31 is not oxidized, and the side surface of the lower gate electrode 34C is not oxidized. Therefore, the junction depth of the impurity diffusion layer 37B does not change, and it is possible to prevent the effective gate length of the gate electrode 36 from being shortened.

Note that while the side wall film 38a is formed from the NSG film 38 in the third embodiment, a silicon nitride ($Si_3N_4$) film may alternatively be deposited on the NSG film 38 so that the side wall film 38a has a layered structure of the silicon nitride film and the NSG film 38. Moreover, the insulating film to be deposited is not limited to a silicon nitride film, and the deposition temperature may be a high temperature of 500° C. or more.

Moreover, another feature of the third embodiment is that the gate electrode 36 has a polymetal electrode structure. As described above, the gate electrode 36 is in a polycide electrode structure when a metal silicide film is used as the upper gate electrode forming layer 35.

In the case of the polymetal electrode structure or the polycide electrode structure, the NSG film 38, which is obtained by depositing an outward diffusion preventing insulating film for the ion implantation region 37A at a reaction temperature of 500° C. or less, is very effective.

Specifically, if the NSG film 38 illustrated in FIG. 8(a) is formed by an HTO film as in the second conventional example, a problem arises in that the surface of the upper gate electrode 35C of the gate electrode 36 is oxidized (abnormally oxidized). However, in the third embodiment, the NSG film 38, which is an insulating film for preventing outward diffusion, is formed at a reaction temperature of about 500° C. or less, whereby it is possible to prevent the abnormal oxidization of the surface of the upper gate electrode 35C.

Furthermore, a source/drain diffusion layer having a greater junction depth than the impurity diffusion layer 37B may be formed after the step of FIG. 8(c), i.e., with the gate electrode 36 and the side wall film 38a as a mask, and then a metal silicide film may be formed in an upper portion of the source/drain diffusion layer. It is preferred that also for the metal silicide film in this case, tungsten silicide ($WSi_2$), molybdenum silicide ($MoSi_2$), titanium silicide ($TiSi_2$), cobalt silicide ($CoSi_2$) or nickel silicide ($NiSi_2$) is used.

Note that in the third embodiment, the MOS transistor to be formed is not limited to a P-channel transistor, but substantially the same effects as those above can be obtained with an N-channel transistor.

Variation of Third Embodiment

A variation of the third embodiment of the present invention will now be described with reference to the drawings.

FIG. 9(a) to FIG. 9(d) are cross-sectional views sequentially illustrating the formation of a gate electrode having a polymetal electrode structure and a capacitor element in the same step in a method for manufacturing a semiconductor device according to the variation of the third embodiment.

Figure 9A:
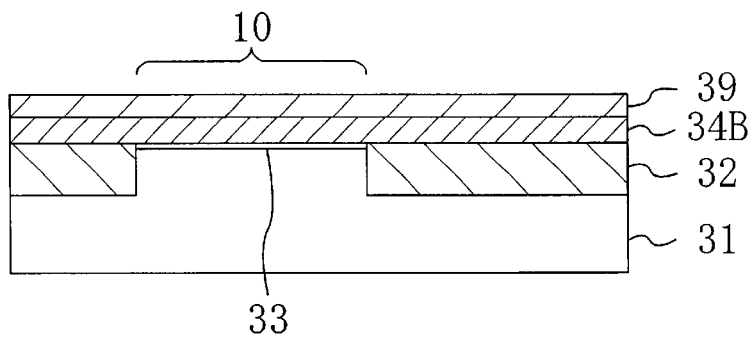
FIG. 9 shows cross-sectional views sequentially illustrating a gate electrode formation step and a capacitor element formation step in a method for manufacturing a semiconductor device according to a variation of the third embodiment of the present invention.

First, the STI region 22 for device isolation is selectively formed in an upper portion of the semiconductor substrate 31 made of silicon. Then, the gate insulating film 33 made of an oxynitride film having a thickness of about 2.8 nm is formed in the transistor forming region 10 on the upper surface of the semiconductor substrate 31. Then, a lower gate electrode forming layer made of amorphous silicon having a thickness of about 80 nm is deposited, and boron ion is implanted, after which an NSG film 39 for preventing outward diffusion having a thickness of about 50 nm is deposited. Then, an activation annealing process is performed in a nitrogen atmosphere at a temperature of about 750° C. for about 30 minutes so as to form the lower gate electrode forming layer 34B made of polysilicon of the P-type conductivity, thereby obtaining a structure as illustrated in FIG. 9(a).

Figure 9B:
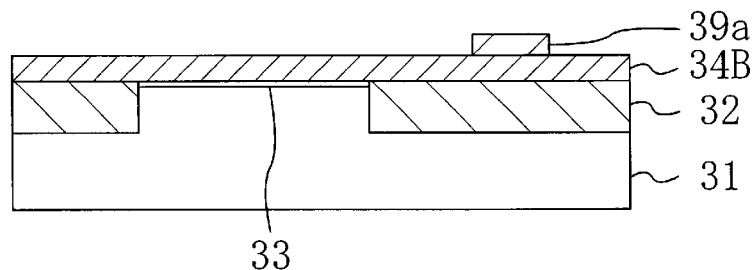

Then, as illustrated in FIG. 9(b), a capacitor insulating film 39a, which is made of the NSG film 39, is formed by selective patterning above the STI region 32 in the semiconductor substrate 31, for example.

Figure 9C:
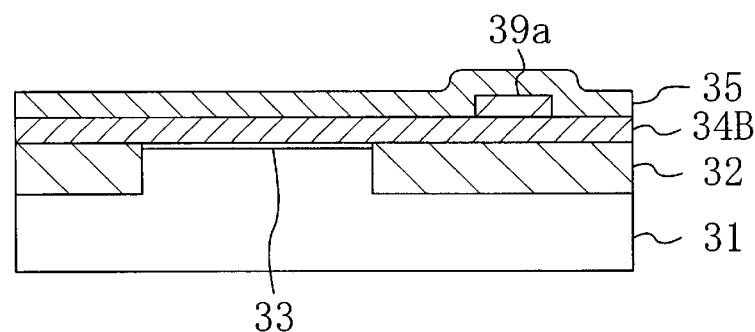

Then, as illustrated in FIG. 9(c), the upper gate electrode forming layer 35 made of tungsten (w) and having a thickness of about 60 nm is deposited across the entire upper surface of the lower gate electrode forming layer 34B including the capacitor insulating film 39a by using a sputtering method or a CVD method.

Figure 9D:
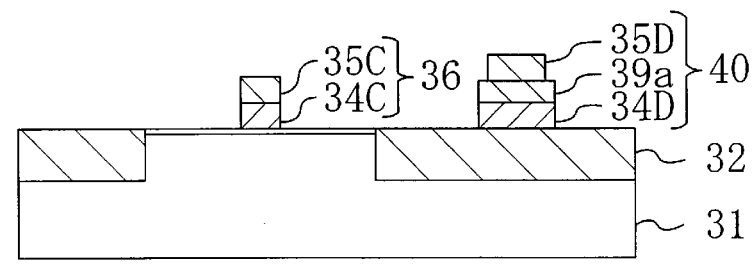

Then, as illustrated in FIG. 9(d), the upper gate electrode forming layer 35 and the lower gate electrode forming layer 34B are selectively etched in the transistor forming region 10 so as to form the upper gate electrode 35C form the upper gate electrode forming layer 35 while forming the lower gate electrode 34C form the lower gate electrode forming layer 34B. At the same time, also on the STI region 32, the upper gate electrode forming layer 35 and the lower gate electrode forming layer 34B are selectively etched, thereby forming an upper electrode 35D from the upper gate electrode forming layer 35 while forming a lower electrode 34D from the lower gate electrode forming layer 34B. In this way, a capacitor element 40 including the lower electrode 34D, the capacitor insulating film 39a thereon, which is made of the NSG film 39, and the upper electrode 35D, can be formed simultaneously with the gate electrode 36.

Thereafter, the impurity diffusion layer 37B is formed in the transistor forming region 10 of the semiconductor substrate 31 through the steps shown in FIG. 7(d) to FIG. 8(c).

Thus, according to the present variation, the NSG film 39 for preventing outward diffusion is used for the capacitor insulating film 39a of the capacitor element 40, whereby it is no longer necessary to form an insulating film for forming a capacitor insulating film in a separate step, thus simplifying the manufacturing process.

Fourth Embodiment

The fourth embodiment of the present invention will now be described with reference to the drawings.

FIG. 10(a) to FIG. 10(d) are cross-sectional views sequentially illustrating a step of forming a gate electrode of a P-channel MOS transistor and a step of forming a source/drain diffusion layer thereof in a method for manufacturing a semiconductor device according to the fourth embodiment of the present invention.

Figure 10A:
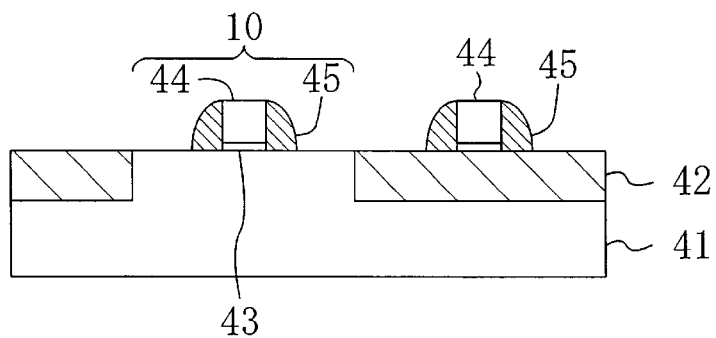
FIG. 10(a) to FIG. 10(d) are cross-sectional views sequentially illustrating a step of forming a gate electrode of a MOS transistor and a step of forming a source/drain diffusion layer thereof in a method for manufacturing a semiconductor device according to the fourth embodiment of the present invention.

First, as illustrated in FIG. 10(a), an STI region 42 for device isolation is selectively formed in an upper portion of a semiconductor substrate 41 made of silicon. Then, a gate insulating film 43 made of an oxynitride film having a thickness of about 2.8 nm is formed in the transistor forming region 10 on the upper surface of the semiconductor substrate 41. Then, a gate electrode 44 made of amorphous silicon having a thickness of about 80 nm is formed. Then, an extension diffusion layer (not shown) is formed in a very small upper portion of the semiconductor substrate 41 by implanting boron ion using the gate electrode 44 as a mask. Then, a silicon oxide film is deposited by using a CVD method, and the deposited silicon oxide film is subjected to an anisotropic dry etching process, thereby forming a side wall film 45 on the side surface of the gate electrode 44.

Figure 10B:
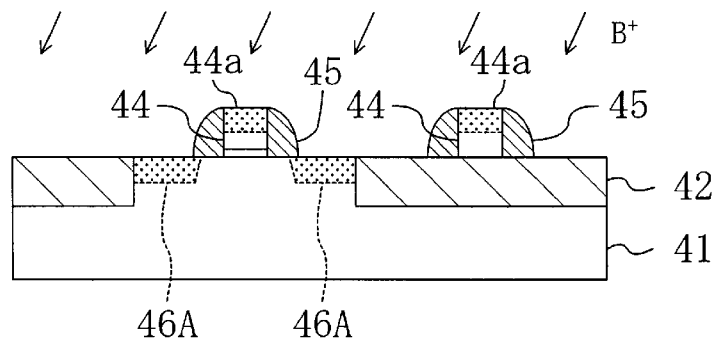

Then, as illustrated in FIG. 10(b), boron ($B^+$) ion is implemented into the transistor forming region 10 of the semiconductor substrate 41 under implantation conditions including an acceleration energy of about 5 keV and an implantation dose of about $2 \times 10^{15}$ cm$^{-2}$ using the gate electrode 44 and the side wall film 45 as a mask, thereby forming a first ion implantation region 46A, which is obtained by implanting boron ion, in the transistor forming region 10 in an upper portion of the semiconductor substrate 41. In this process, the first implantation region 46A is turned amorphous. At the same time, a second ion implantation region 44a, which is obtained by implanting boron ion, is formed also in an upper portion of each gate electrode 44.

Figure 10C:
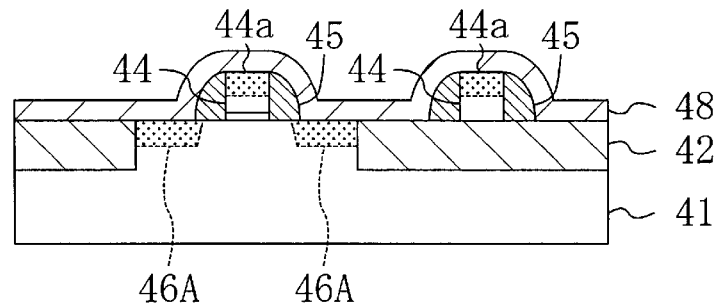

Then, as illustrated in FIG. 10(c), an NSG film 48, which is an insulating film for preventing outward diffusion having a thickness of about 50 nm, is deposited across the entire upper surface of the semiconductor substrate 41 including the gate electrode 44 and the side wall film 45 by a CVD method in which ozone is used as an oxidizing gas for TEOS with a reaction pressure of about $2.7 \times 10^4$ Pa and a reaction temperature of about 500° C. or less.

Figure 10D:
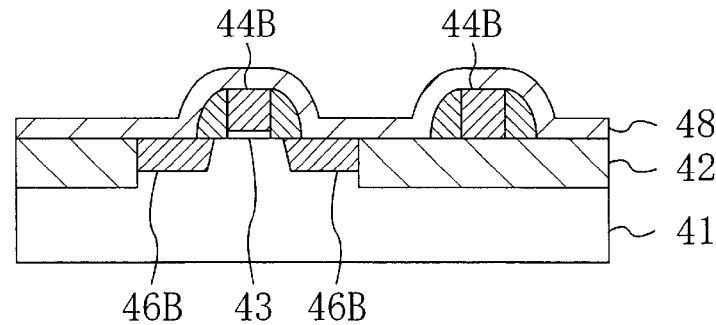

Then, as illustrated in FIG. 10(d), the first ion implantation region 46A and the second ion implantation region 44a are subjected to an activation annealing process performed by an RTA method in a nitrogen atmosphere at a temperature of about 975° C. for about 30 seconds. Thus, the first ion implantation region 46A is turned into a source/drain diffusion layer 46B, which is obtained by activating the implanted boron ion. On the other hand, the boron ion implanted into the second ion implantation region 44a is activated, and diffuses through thermal diffusion to the vicinity of the interface with the gate insulating film 43. Thus, the amorphous gate electrode 44 is turned into a recrystallized gate electrode layer 44B having a P-type conductivity.

As described above, according to the fourth embodiment, impurity ion is implanted into the transistor forming region 10 of the semiconductor substrate 41, and then the NSG film 48 for preventing outward diffusion is deposited at a relatively low temperature of about 500° C. or less, whereby it is possible to prevent the outward diffusion of boron ion from the transistor forming region 10 and the gate electrode 44B in an early stage of the deposition. In addition, the surface of the transistor forming region 10 of the semiconductor substrate 41 is not oxidized, and the surface of the gate electrode 44B is not oxidized. Therefore, the junction depth of the source/drain diffusion layer 46B does not change, and the effective gate length of the gate electrode 44B is not shortened.

Note that in the fourth embodiment, the MOS transistor to be formed is not limited to a P-channel transistor, but substantially the same effects as those above can be obtained with an N-channel transistor.

Variation of Fourth Embodiment

A variation of the fourth embodiment of the present invention will now be described with reference to the drawings.

Figure 12:
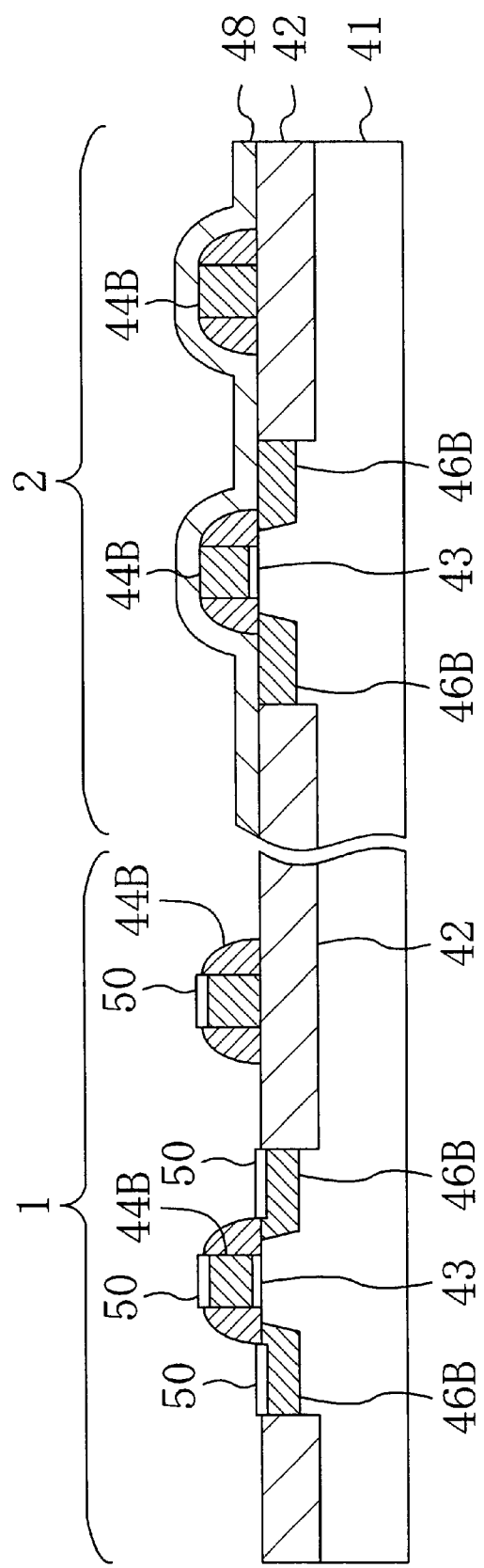
FIG. 12 is a cross-sectional view sequentially illustrating a silicification step in the method for manufacturing a semiconductor device according to a variation of the fourth embodiment of the present invention.
Figure 13A:
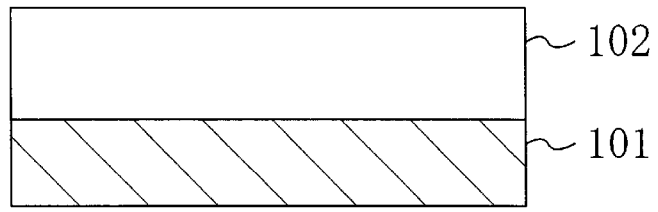
FIG. 13(a) to FIG. 13(c) are cross-sectional views sequentially illustrating an impurity ion implantation step and an impurity ion activation annealing step according to the first conventional example.
Figure 13B:
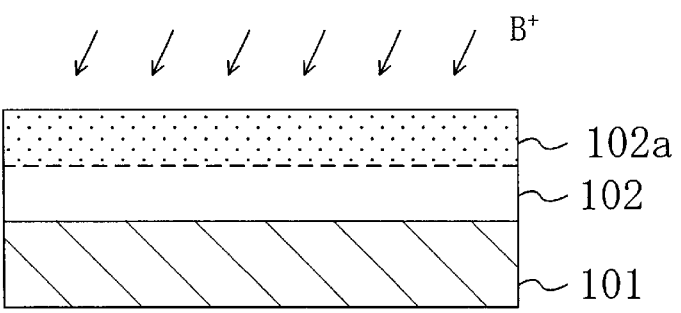
Figure 13C:
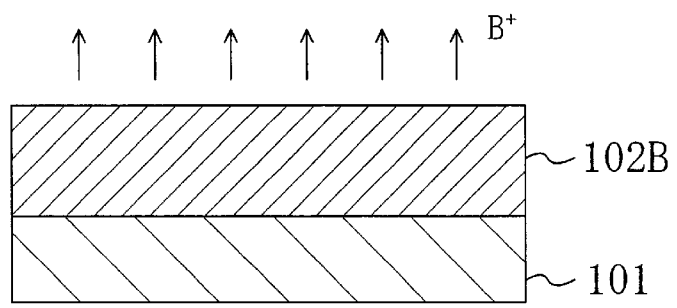
Figure 14A:
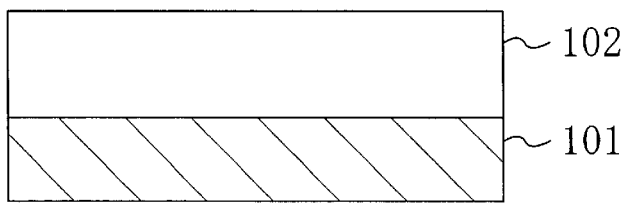
FIG. 14(a) to FIG. 14(d) are cross-sectional views sequentially illustrating an impurity ion implantation step and an impurity ion activation annealing step according to the second conventional example.
Figure 14B:
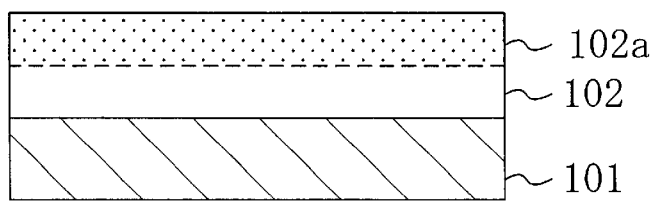
Figure 14C:
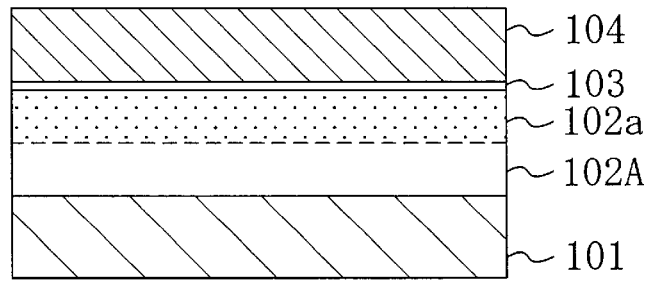
Figure 14D:
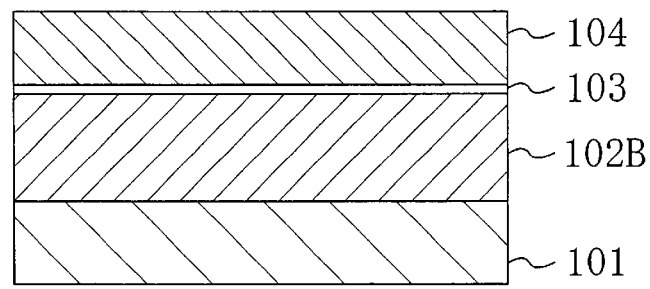

FIG. 11(a), FIG. 11(b) and FIG. 12 are cross-sectional views sequentially illustrating a step of silicifying a gate electrode and a source/drain diffusion layer in a method for manufacturing a semiconductor device according to the variation of the fourth embodiment.

The present variation is a subsequent step to FIG. 10(d) illustrated in the fourth embodiment, and assumes a case where some of the plurality of transistors on the semiconductor substrate 41 in a first region 1 are silicified, and others in a second region 2 are not silicified. Herein, an SRAM circuit, a logic circuit, or the like, for example, is included in the first region 1 in which silicification is performed, whereas an electrostatic breakdown prevention (ESD) protection circuit, or the like, for example, is included in the second region 2 in which silicification is not performed.

First, as illustrated in FIG. 11(a), a portion of the NSG film 48 that covers the first region 1 is selectively removed.

Then, as illustrated in FIG. 11(b), a metal film 49 made of tungsten, for example, is deposited to a thickness of about 10 nm across the entire surface of the semiconductor substrate 41 by a sputtering method. In this process, the metal film 49 directly contacts with the exposed surfaces of the source/drain diffusion layer 46B made of silicon and the gate electrode 44B made of silicon, in the first region 1 in which the NSG film 48 has been removed. On the other hand, in the second region 2 in which the NSG film 48 is not removed, it does not directly contact with the source/drain diffusion layer 46B or the gate electrode 44B.

Then, the semiconductor substrate 41 is subjected to an annealing process at a temperature of about 800° C. for about 30 seconds, whereby the contact surface between a portion of the metal film 49 in the first region 1 and the source/drain diffusion layer 46B and the contact surface between the portion of the metal film 49 in the first region 1 and the gate electrode 44B react to form a metal silicide film 50. Then, an unreacted portion of the metal film 49 is washed away with a mixed liquid of hydrochloric acid (HCl) and a hydrogen peroxide solution ($H_2O_2$). Then, a structure in which a portion of the NSG film 48 that covers the second region 2 is left unremoved is obtained, thereby obtaining a structure as illustrated in FIG. 12.

According to the present variation, the NSG film 48 for preventing outward diffusion is used as a mask film (sacrificial film) for preventing the silicification of the gate electrode 44B and the source/drain diffusion layer 46B in the second region 2, whereby it is no longer necessary to form a mask film for preventing silicification in a separate step, thus simplifying the manufacturing process.

Note that while the metal film 49 is a tungsten film and the metal silicide film 50 is a tungsten silicide ($WSi_2$) film in the present variation, the tungsten silicide ($WSi_2$) film is merely an example. Therefore, molybdenum silicide ($MoSi_2$), titanium silicide ($TiSi_2$), cobalt silicide ($CoSi_2$) or nickel silicide ($NiSi_2$) may alternatively be used for the metal silicide film 50.

Moreover, while a nitrogen ($N_2$) gas is used for the non-oxidizing atmosphere during the activation annealing process in the embodiments and variations described above, an argon (Ar) gas may be used instead of a nitrogen gas.

What is claimed is:

1. A method for manufacturing a semiconductor device, comprising:

a first step of implanting a group III or V impurity ion into a semiconductor layer so as to form an amorphized ion implantation region in the semiconductor layer;

a second step of forming an insulating film on the semiconductor layer at a temperature at which the ion implantation region is not crystallized; and after the second step in which the insulating film is being formed, a third step of annealing the semiconductor layer in a non-oxidizing atmosphere so as to activate the impurity ion implanted into the semiconductor layer.

2. The method for manufacturing a semiconductor device of claim 1, wherein the semiconductor layer is deposited in an amorphous state in the first step, after which the impurity ion is implanted.

3. The method for manufacturing a semiconductor device of claim 1, wherein the semiconductor layer is deposited in a polycrystalline state in the first step, after which the impurity ion is implanted into the deposited semiconductor layer, thereby turning the ion implantation region amorphous.

4. The method for manufacturing a semiconductor device of claim 1, wherein the insulating film is a silicon oxide film obtained by reacting tetraethylorthosilicate (TEOS) and ozone with each other.

5. The method for manufacturing a semiconductor device of claim 1, wherein:

the annealing is performed by a rapid thermal annealing (RTA) method or a furnace annealing (FA) method; and the non-oxidizing atmosphere is made of nitrogen or argon.

6. The method for manufacturing a semiconductor device of claim 1, wherein:

the temperature at which the ion implantation region is not crystallized is a temperature of 500° C. or less; and a temperature of the annealing is 700° C. or more.

7. A method for manufacturing a semiconductor device, comprising:

a first step of forming a gate insulating film on a semiconductor substrate;

a second step of forming a semiconductor layer made of amorphous silicon or polycrystalline silicon on the gate insulating film;

a third step of implanting a group III or V impurity ion into a gate electrode forming region of the semiconductor layer so as to form an amorphized ion implantation region in the gate electrode forming region;

a fourth step of, after the third step, forming an insulating film on the semiconductor layer at a temperature at which the ion implantation region is not crystallized;

after the fourth step in which the insulating film is being formed, a fifth step of annealing the semiconductor layer in a non-oxidizing atmosphere so as to activate the impurity ion; and a sixth step of, after the fifth step, patterning the gate electrode forming region of the semiconductor layer so as to form a gate electrode from the semiconductor layer.

8. The method for manufacturing a semiconductor device of claim 7, wherein:

the temperature at which the ion implantation region is not crystallized is a temperature of 500° C. or less; and a temperature of the annealing is 700° C. or more.

9. The method for manufacturing a semiconductor device of claim 7, wherein the insulating film is a silicon oxide film obtained by reacting tetraethylorthosilicate (TEOS) and ozone with each other.

10. The method for manufacturing a semiconductor device of claim 7, wherein:

the annealing is performed by a rapid thermal annealing (RTA) method or a furnace annealing (FA) method; and the non-oxidizing atmosphere is made of nitrogen or argon.

11. A method for manufacturing a semiconductor device, comprising:

a first step of sequentially forming a gate insulating film and a gate electrode on a semiconductor substrate made of silicon;

a second step of implanting a group III or V impurity ion onto the semiconductor substrate using the gate electrode as a mask so as to form an ion implantation region in the semiconductor substrate;

a third step of forming an insulating film across an entire upper surface of the semiconductor substrate including the gate electrode at a temperature at which the ion implantation region is not crystallized; and after the third step in which the insulating film is being formed, a fourth step of annealing the semiconductor substrate in a non-oxidizing atmosphere so as to activate the impurity ion, thereby forming an impurity diffusion layer in a region of the semiconductor substrate beside the gate electrode.

12. The method for manufacturing a semiconductor device of claim 11, further comprising, after the fourth step, a fifth step of anisotropically etching the insulating film so as to form a side wall, which is made of the insulating film, on a side surface of the gate electrode.

13. The method for manufacturing a semiconductor device of claim 12, further comprising, after the fifth step:

a sixth step of depositing a metal film across an entire upper surface of the semiconductor substrate including the gate electrode; and a seventh step of subjecting the deposited metal film to a heat treatment so as to form a metal silicide film along an interface between the metal film and the gate electrode and an interface between the metal film and the impurity diffusion layer.

14. The method for manufacturing a semiconductor device of claim 13, wherein the metal silicide film is made of tungsten silicide, molybdenum silicide, titanium silicide, cobalt silicide or nickel silicide.

15. The method for manufacturing a semiconductor device of claim 11, wherein the first step includes a step of forming a metal film or a metal silicide film on the gate electrode.

16. The method for manufacturing a semiconductor device of claim 15, wherein:

the metal film is made of tungsten; and the metal silicide film is made of tungsten silicide, molybdenum silicide, titanium silicide, cobalt suicide or nickel silicide.

17. The method for manufacturing a semiconductor device of claim 11, wherein:

the temperature at which the ion implantation region is not crystallized is a temperature of 500° C. or less; and a temperature of the annealing is 700° C. or more.

18. The method for manufacturing a semiconductor device of claim 11, wherein the insulating film is a silicon oxide film obtained by reacting tetraethylorthosilicate (TEOS) and ozone with each other.

19. The method for manufacturing a semiconductor device of claim 11, wherein:

the annealing is performed by a rapid thermal annealing (RTA) method or a furnace annealing (FA) method; and the non-oxidizing atmosphere is made of nitrogen or argon.

20. A method for manufacturing a semiconductor device, comprising:

a first step of sequentially forming a gate insulating film and a gate electrode containing silicon on a semiconductor substrate made of silicon and having a first region and a second region;

a second step of implanting a group III or V impurity ion onto the semiconductor substrate using the gate electrode as a mask so as to form an amorphized ion implantation region in the semiconductor substrate;

a third step of forming an insulating film across an entire upper surface of the semiconductor substrate including the gate electrode at a temperature at which the ion implantation region is not crystallized;

after the third step in which the insulating film is being formed, a fourth step of annealing the semiconductor substrate in a non-oxidizing atmosphere so as to activate the impurity ion, thereby forming an impurity diffusion layer in a region of the semiconductor substrate beside the gate electrode;

a fifth step of, after the fourth step, removing a portion of the insulating film that is included in the first region and that is above the gate electrode or the impurity diffusion layer; and a sixth step of, after the fifth step, depositing a metal film across an entire upper surface in the first region and the second region and subjecting the deposited metal film to a heat treatment so as to form a metal silicide film along an interface between the metal film and the gate electrode and an interface between the metal film and the impurity diffusion layer in the first region.

21. The method for manufacturing a semiconductor device of claim 20, wherein:

the temperature at which the ion implantation region is not crystallized is a temperature of 500° C. or less; and a temperature of the annealing is 700° C. or more.

22. The method for manufacturing a semiconductor device of claim 20, wherein the insulating film is a silicon oxide film obtained by reacting tetraethylorthosilicate (TEOS) and ozone with each other.

23. The method for manufacturing a semiconductor device of claim 20, wherein: the annealing is performed by a rapid thermal annealing (RTA) method or a furnace annealing (FA) method; and the non-oxidizing atmosphere is made of nitrogen or argon.

* * * * *